United States Patent [19]

Fukudome

[11] Patent Number: 5,038,189

[45] Date of Patent: Aug. 6, 1991

[54] SEMICONDUCTOR LASER DRIVING CIRCUIT

[75] Inventor: Fujito Fukudome, Tokyo, Japan

[73] Assignee: Fujitsu Limited, Kawasaki, Japan

[21] Appl. No.: 484,777

[22] Filed: Feb. 26, 1990

[30] Foreign Application Priority Data

Mar. 1, 1989 [JP] Japan ........................... 1-049070

[51] Int. Cl.⁵ .............................................. H01S 3/00
[52] U.S. Cl. ............................................ 372/38; 372/29
[58] Field of Search ................................. 372/29, 38

[56] References Cited

U.S. PATENT DOCUMENTS 4,807,239 2/1989 Takano et al. ...................... 372/38

FOREIGN PATENT DOCUMENTS 0220669 5/1987 European Pat. Off. ............. 372/38

0010279 1/1982 Japan .................................. 372/38

Primary Examiner—Léon Scott, Jr.
Attorney, Agent, or Firm—Staas & Halsey

[57] ABSTRACT

A semiconductor laser driving circuit is arranged so that a predetermined number of transistors can be selected from a group of transistors disposed in parallel according to the characteristics of a semiconductor laser and the selected transistors are connected in parallel between the semiconductor laser and a current source. An optimum current is allowed to flow through the semiconductor laser to cause it to generate a required light output. Moreover, a collector current which provides the optimum characteristics flows through each of the selected transistors. Therefore, an optimum high-speed response can always be realized irrespective of the magnitude of the driving pulse current of the semiconductor laser.

21 Claims, 7 Drawing Sheets

SEMICONDUCTOR LASER DRIVING CIRCUIT

BACKGROUND OF THE INVENTION

1. Field of the Invention

The present invention relates to a semiconductor laser driving circuit and, more particularly, to a semiconductor laser driving circuit comprising an output circuit composed of a plurality of transistors connected in parallel and a current source.

2. Description of the Related Art

Semiconductor lasers used in light output circuits for optical communication during daytime require driving circuits which accommodate variations in values of components used and variations in temperature.

FIG. 1 illustrates an example of a prior art semiconductor driving circuit. This circuit comprises a parallel circuit 2 having n (n>1) transistors Tr11 to Tr1n connected in parallel and a parallel circuit 20 having n transistors Tr21 to Tr2n connected in parallel. Circuits 2 and 20 together constitute a differential pair forming a differential amplifier. A common base input V1 of parallel circuit 2 and a common base input V2 of parallel circuit 20 are supplied with pulse signals of opposite polarities. When the common base input V1 is on, transistors Tr11 to Tr1n are all turned on so that a semiconductor laser 1 is driven by a current source 3 to emit a desired light output pulse. The differential pair portion shown by broken lines in FIG. 1 is usually used in the form of an integrated circuit (refer to Japanese Unexamined Patent Publications Nos. 57-10279 and 63-119281).

With the circuit of FIG. 1, the number of transistors constituting parallel circuit 2 is preselected such that a (rated) collector current is allowed to flow through each transistor, optimizing the characteristics of each transistor, i.e., which maximizes the current amplification factor hFE, like the collector current Ic1 shown in FIG. 2 when an allowable maximum current flowing through the semiconductor laser 1 is divided equally by transistors Tr11 to Tr1n.

The current source 3 is designed so that its current Io (=Ip) can be varied in order to produce a driving pulse current Ip which generates a desired light output Po to flow through the semiconductor laser 1, as shown in FIG. 3, when the current Ip flowing through the semiconductor laser 1 is varied by variations in the elements used and by variations in temperature.

With such a semiconductor laser driving circuit, however, the driving pulse current Ip may be small and the driving pulse current Ip may have to be increased. This depends upon variations in the semiconductor laser 1 and variations in temperature. If the current Io of current source 3 is varied accordingly, the collector current flowing through each of the transistors will become, for example, Ic1 (where the current amplification factor has a maximum value of hFE1) or Ic2 (where the current amplification factor is hFE2 less than hFE1). These different collector currents Ic1 and Ic2 will result in different operating frequency characteristics, as shown in FIG. 4.

As a result, the high-speed response characteristics of each transistor, particularly the waveform rising and falling characteristics for Ic2 shown by the broken line in FIG. 5, will be significantly degraded compared with those for Ic1 shown by the solid line in FIG. 5. The light output waveform of semiconductor laser 1 will be similarly degraded.

SUMMARY OF THE INVENTION

It is accordingly an object of the present invention to provide a semiconductor laser driving circuit which avoids the degradation of high-speed response characteristics of each transistor in the driving circuit even if a driving pulse current flowing through a semiconductor laser is varied.

A feature of the present invention resides in a semiconductor laser driving circuit comprising a current source for supplying a current to a semiconductor laser, a transistor group in which a plurality of transistors is disposed in parallel and a predetermined number of transistors selected from said transistor group being connected in parallel between said current source and said semiconductor laser; and wherein the number of transistors constituting said transistor group is set such that an equal collector current flows through each of the transistors, thus optimizing their operating characteristics when an allowable maximum current of said semiconductor laser is equally divided by all of the transistors in said transistor group, and the number of selected transistors is set such that a current is allowed to flow through said semiconductor laser, causing it to generate a required light output, and the optimum collector current flows through all of the selected transistors.

DETAILED DESCRIPTION OF THE PREFERRED EMBODIMENTS

Figure 6:
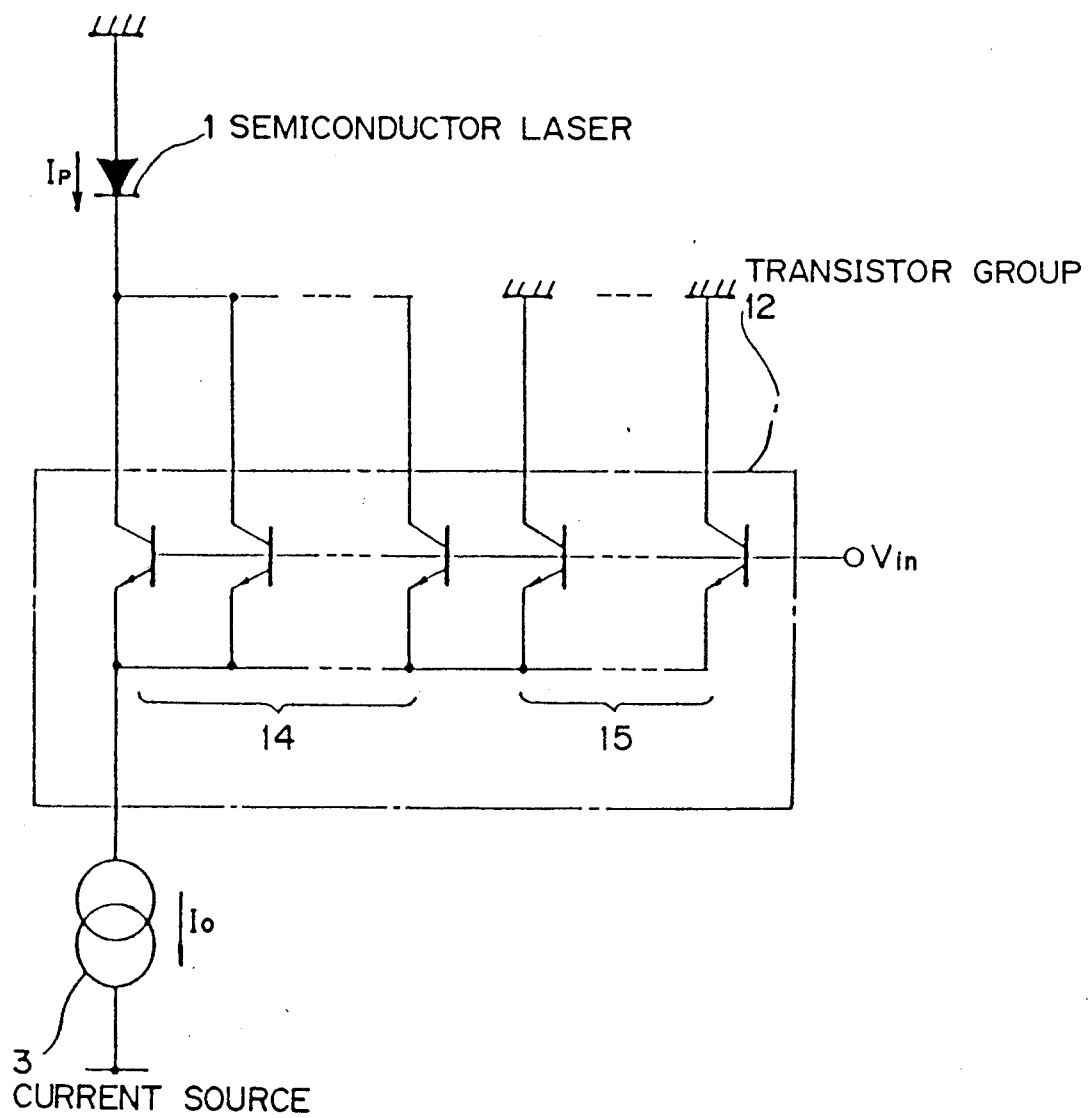
FIG. 6 is a schematic circuit diagram illustrating the principle of a semiconductor laser driving circuit according to the present invention.

As shown in FIG. 6, which illustrates the principle of the invention, the semiconductor laser driving circuit comprises a current source 3 for supplying a current to a semiconductor laser 1 and a transistor group 12 in which a plurality of transistors are connected in parallel. A predetermined number of transistors 14, connected in parallel and selected from the transistor group 12, are connected between the semiconductor laser 1 and the current source 3.

The number of transistors forming the transistor group 12 is set such that, when an allowable maximum current flowing through the semiconductor laser 1 is equally divided by all the transistors of the transistor group 12, a collector current flows through each of the transistors which optimizes its characteristics (that is, the current amplification factor hFE has a maximum value).

Also, the number of transistors 14 to be selected from the transistor group 12 is set such that a current Ip for generating a required light output Po flows through the semiconductor laser 1 and the optimum collector current flows through each of the transistors 14.

It is also possible to supply the optimum collector current to each of the transistors 15 as well as to the selected transistors 14 in the transistor group 12, from the current source 3.

By setting the number of transistors forming the transistor group 12 and the number of transistors 14 connected to the semiconductor laser 1 as described above, the present invention produces two main advantages.

Figure 2:
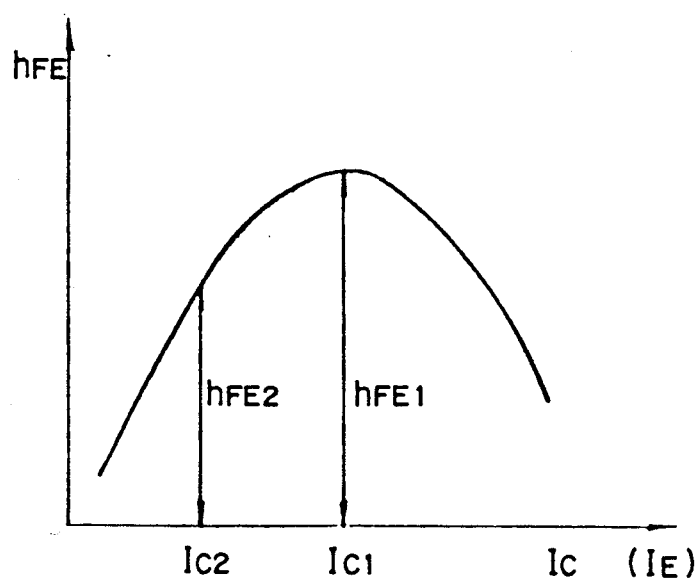
FIG. 2 is a graph for showing the collector current for optimum transistor characteristics.
Figure 3:
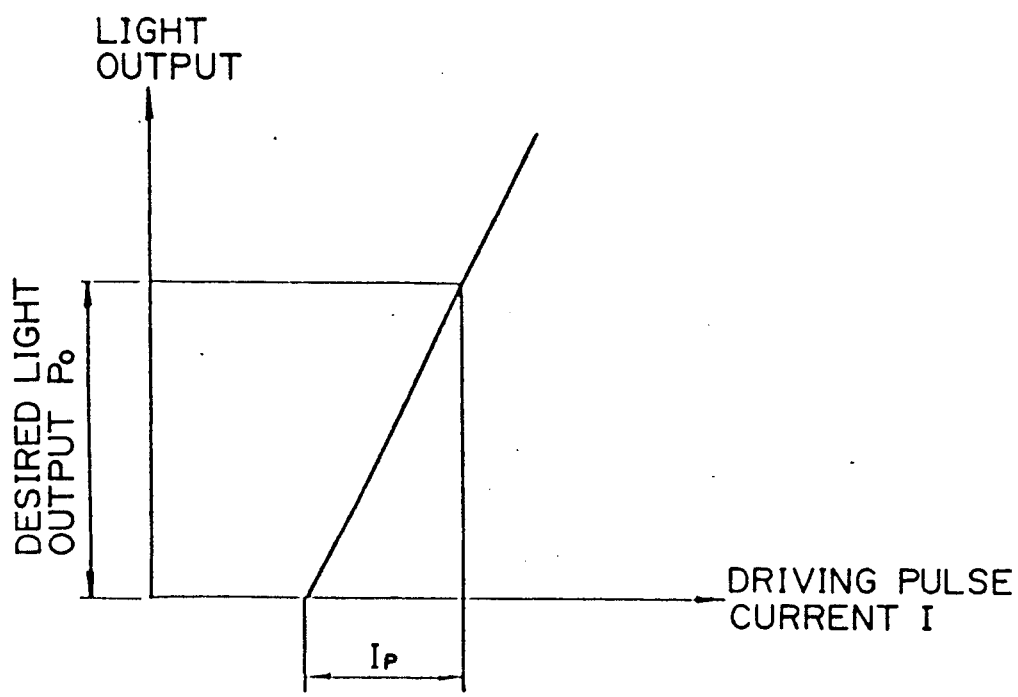
FIG. 3 is a graph illustrating a driving pulse current for obtaining a desired light output.
Figure 4:
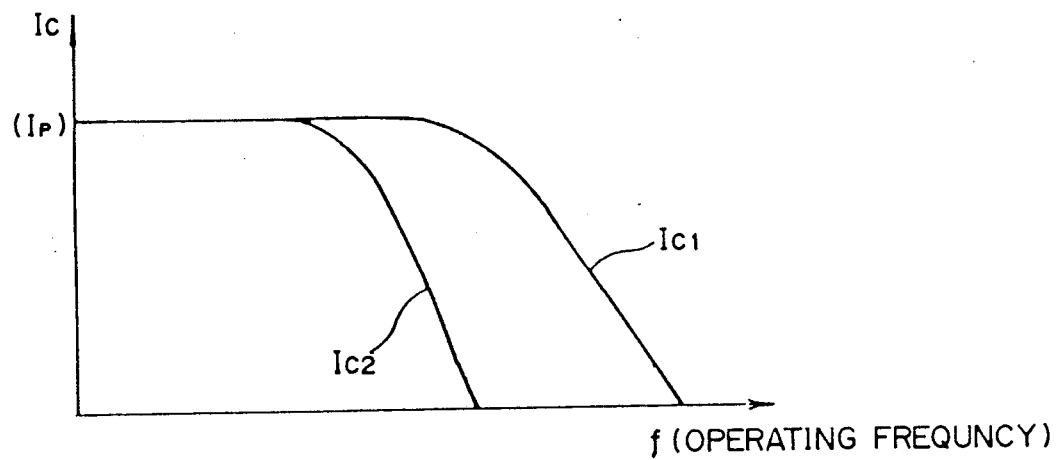
FIG 4 shows the collector current versus operating frequency characteristics for a transistor.
Figure 5:
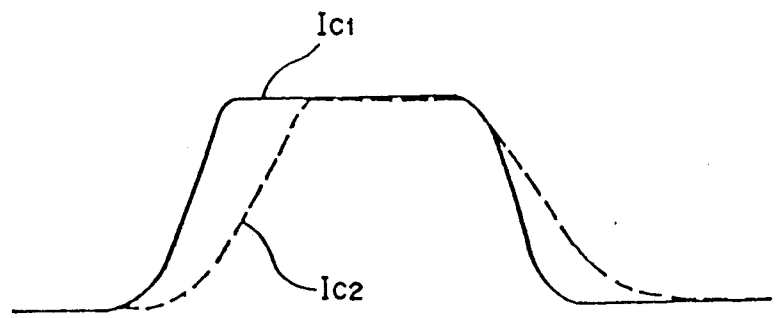
FIG. 5 is a waveform diagram illustrating the high-speed response characteristics of the transistors and the semiconductor laser in the driving circuit.

Firstly, the driving pulse current Ip flows through the semiconductor laser 1, which causes the laser 1 to deliver the required light output Po (refer to FIG. 3), and the same optimum collector current always flows through each of a predetermined number of transistors 14 connected to the semiconductor laser 1. Therefore, the collector current of each transistor has an optimum fixed value, such as Ic1, as shown in FIG. 2, even if the driving pulse current Ip varies from sample to sample of a given type of semiconductor laser used. This prevents degradation of the high-speed response characteristics (rising and falling characteristics) of each of the transistors used.

Secondly, if the transistors 15 as well as the selected transistors 14 in the transistor group 12 are connected to the current source 3 so as to be supplied with the optimum collector current therefrom, stray capacitance can be eliminated from the transistors 15 and a driving circuit comprising the transistor group 12 can be used as one of a differential pair. This will allow the semiconductor laser to be driven with faster response characteristics.

Figure 1:
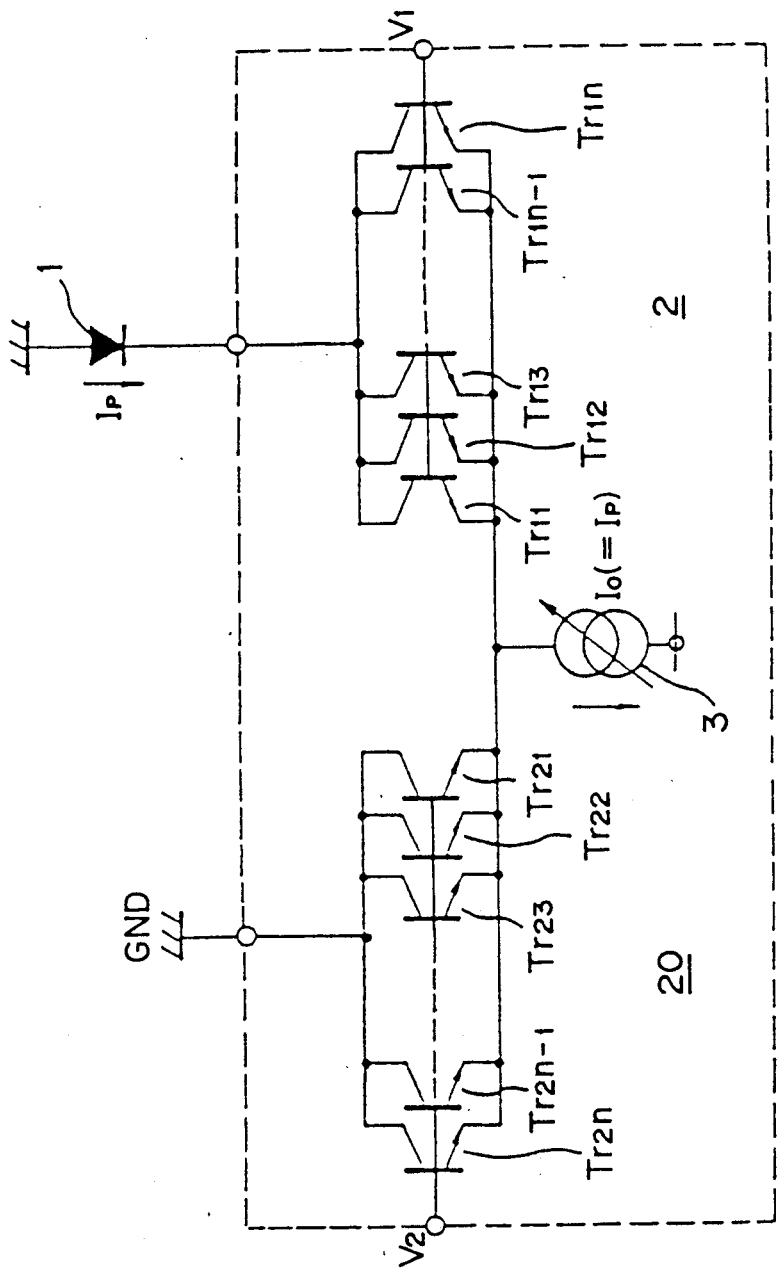
FIG. 1 is a circuit diagram of a prior art semiconductor laser driving circuit.
Figure 7:
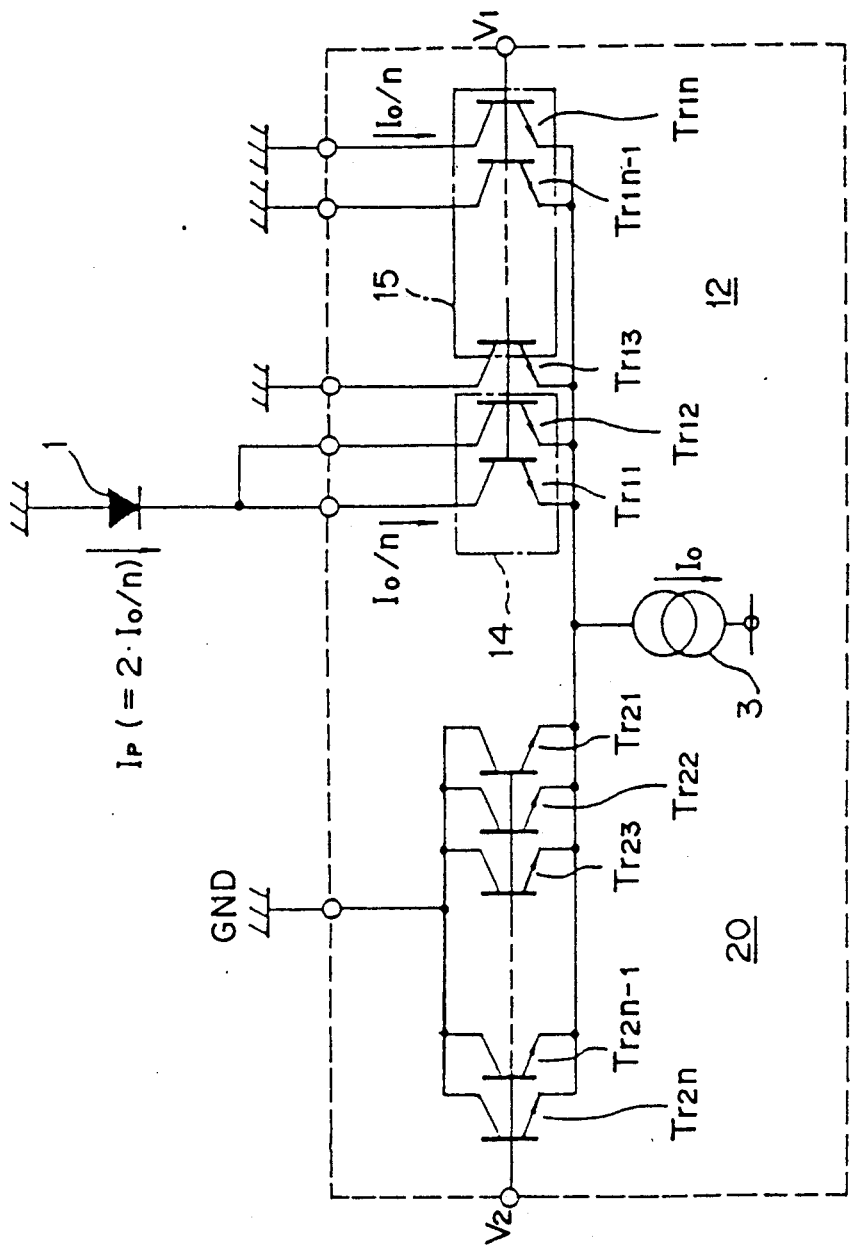
FIG. 7 illustrates an embodiment of the semiconductor laser driving circuit according to the present invention.
Figure 8:
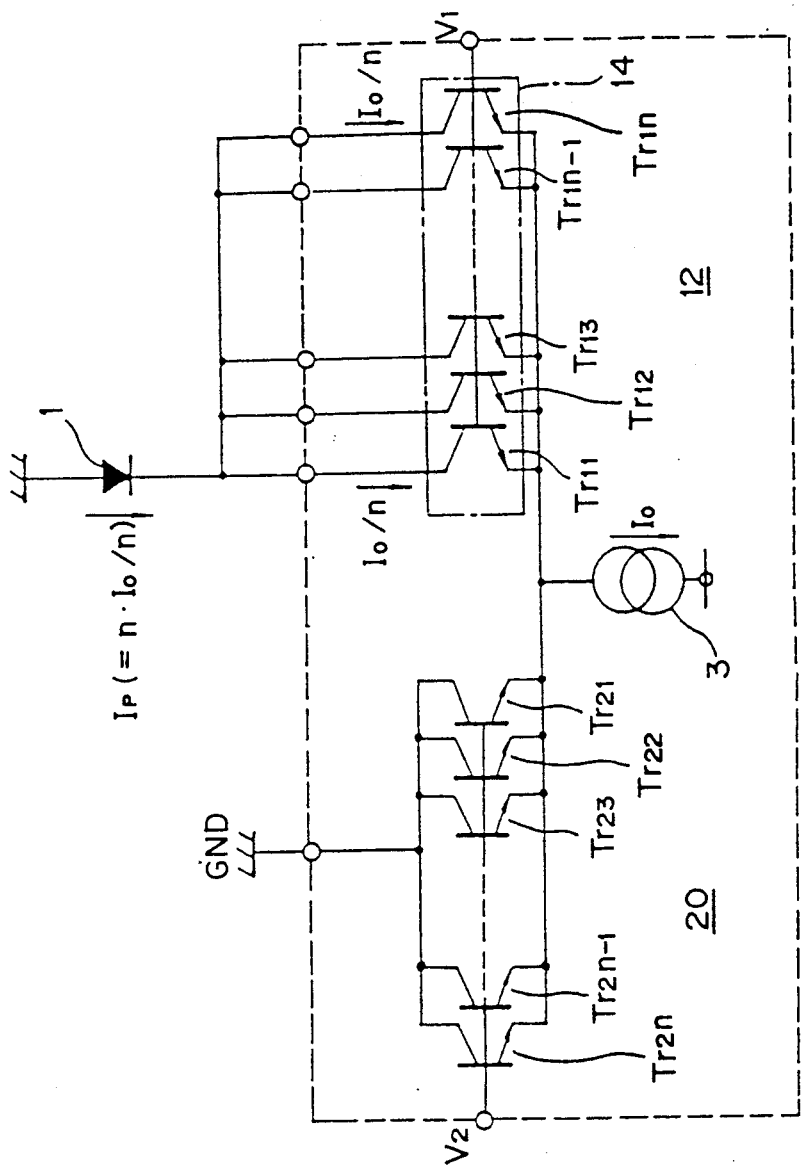
FIG. 8 illustrates another embodiment of the semiconductor laser driving circuit according to the present invention.

In each of the embodiments of FIGS. 7 and 8, a semiconductor laser driving circuit comprises a differential pair composed of a transistor parallel circuit 20 as in the prior driving circuit shown in FIG. 1 and a transistor group 12 having the same number of transistors as the transistor parallel circuit 20. In these embodiments, the current Io of the current source 3 is selected so as to accommodate the maximum value of the driving pulse current Ip, which is subject to variation due to manufacturing processes, of the semiconductor laser 1.

The number n of transistors constituting the differential pair in the transistor group 12 is selected such that n=Io/Ico, where Ico is the optimum collector current for a transistor and Io is the current supplied by current source 3. Thus, the collector current Ico supplied to the semiconductor laser 1 by one of the transistors is given by Io/n.

In the embodiment of FIG. 7, the optimum driving pulse current Ip (refer to FIG. 3) for the semiconductor laser 1 is 2Io/n. For this reason, two transistors Tr11 and Tr12 are connected in parallel between the semiconductor laser 1 and the current source 3. The other transistors Tr13 through Tr1n have their emitters connected to the current source 3 and their collectors connected to ground.

In the embodiment of FIG. 8, on the other hand, the semiconductor laser 1 requires a driving pulse current of n×Io/n. Thus, in this case, all the transistors Tr11 through Tr1n are connected in parallel between the semiconductor laser 1 and the current source 3. In general, where the semiconductor laser 1 requires m×Io/n (m≦n) as its optimum driving current Ip, m transistors are arbitrarily selected from the transistor group 12 and connected between the semiconductor laser 1 and the current source 3.

The embodiments of FIGS. 7 and 8 are distinct from each other in the optimum driving pulse current Ip for the semiconductor laser 1. However, in both embodiments, the current flowing through each of the transistors in the transistor group 12 has a constant value of Io/n, independent of the magnitude of the driving pulse current for the semiconductor laser.

For this reason, even if the characteristics of the semiconductor laser 1 vary from sample to sample, the switching current flowing through the transistor group 12 always amount to Io, which is identical to that of the transistor parallel circuit 20, thus forming a differential pair with the transistor group. Thus, the degradation in the high-speed response characteristics of the driving circuit can be minimized.

In the above embodiment, the driving circuit is formed of a differential pair. However, a differential pair configuration may not be needed so long as bipolar transistors are used. In addition, the transistors 15 as well as the transistors 14 connected to the semiconductor laser 1 are connected to ground. This is to allow the same current to flow through each of the transistors in transistor group 12 and transistor parallel circuit 20, which form the differential pair, and to eliminate stray capacitances and thereby achieve a high-speed response. Even where the transistors 15 are not supplied with current, degradation of waveforms is prevented.

Figure 9:
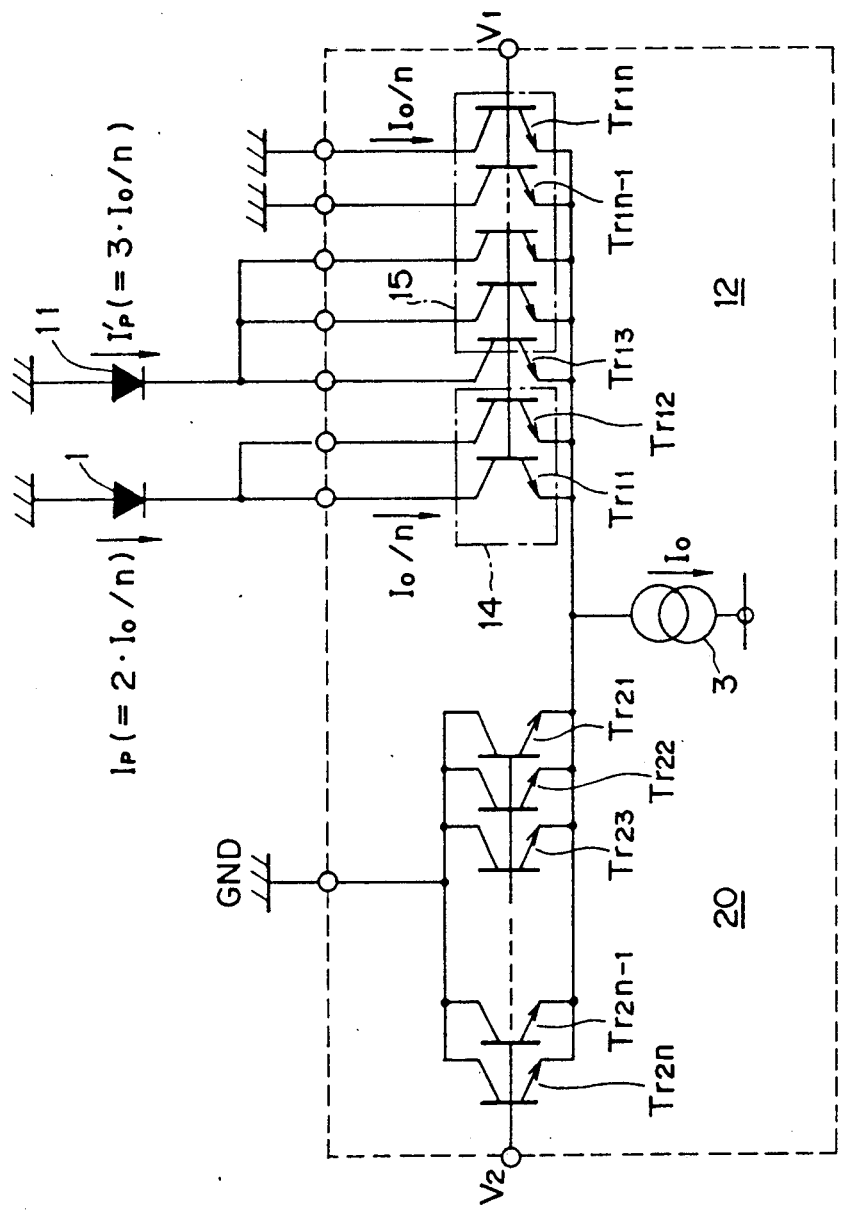
FIG. 9 illustrates a further embodiment of the semiconductor laser driving circuit according to the present invention.

Furthermore, if the transistors constituting transistor group 12 have their emitters connected together and their bases connected together, their collector currents remain unchanged. Thus, it is not necessarily required to directly connect all of the transistors 15 to ground as shown in FIG. 7. For example, suitable resistors may be connected between the transistors 15 and ground. Alternatively, another semiconductor laser 11 may be connected between the transistors 15 and ground as shown in FIG. 9. In this case, if the semiconductor lasers 1 and 11 have different characteristics, the number of transistors to be connected to them will vary according to these characteristics.

The transistors 14 may be connected to semiconductor laser 1 by bonding with a conductive material. Alternatively, the selection of transistors may be made by means of a switch between the transistor group 12 and the semiconductor laser 1.

In the above embodiments, npn bipolar transistors are used. Of course, pnp bipolar transistors may be used instead. In this case, each pnp transistor has its emitter electrode (one of its main electrodes) connected to the semiconductor laser 1 and its collector (the other of its main electrodes) connected to the current source 3. If the driving circuit is arranged such that currents flow in the opposite direction, the transistors are disposed accordingly.

As described above, according to the present invention, by connecting a predetermined number of transistors selected from a group of transistors connected in parallel between a semiconductor laser and a current source, a semiconductor laser driving circuit can be arranged such that a current flows through the semiconductor laser to deliver a required light output and an optimum collector current flows through all of the predetermined transistors. Accordingly, the collector current of all of the transistors always has a constant optimum value irrespective of the magnitude of the current necessary for the semiconductor laser. Thus, optimum high-speed response is always achieved.

If, in that case, transistors other than those connected to the semiconductor laser are equally supplied with an equal optimum collector current, the driving circuit can be used in the form of a differential pair, thus eliminating stray capacitances. Accordingly, a semiconductor laser driving circuit with faster response characteristics can be implemented.

What is claimed is:

1. A semiconductor laser driving circuit for driving a semiconductor laser comprising:
   a current source capable of supplying a current to the semiconductor laser;
   a group of transistors, each having a respective maximum current amplifying rate, connected to said current source; and
   means for selectively connecting a number of transistors from said group in parallel with one another and to the semiconductor laser such that a current characteristic of said semiconductor laser matches a sum of optimum currents for the number of transistors thereby each transistor operating at a current exhibiting its maximum current amplifying rate.

2. A semiconductor laser driving circuit according to claim 1, in which all of said transistors constituting said group have similar structures and characteristics as one another.

3. A semiconductor laser driving circuit according to claim 2, in which said transistors constituting said group are bipolar transistors having their corresponding main electrodes connected together and to said current source.

4. A semiconductor laser driving circuit according to claim 3, in which transistors from said group not connected in parallel and to the semiconductor laser have other main electrodes coupled to ground.

5. A semiconductor laser driving circuit according to claim 4, in which all of said transistors constituting said group include base electrodes connected in common to be simultaneously driven by a signal applied to said base electrodes.

6. A semiconductor laser driving circuit according to claim 5, further comprising a transistor parallel circuit having the same number of parallel connected transistors as said group, said transistor parallel circuit being connected to said group to form a differential pair.

7. A semiconductor laser driving circuit according to claim 6, wherein said means for selectively connecting comprises a conductive material connecting said number of transistors to the semiconductor laser by bonding.

8. A semiconductor laser driving circuit according to claim 7, wherein said means for selectively connecting comprises a change-over switch disposed between said number of transistors and the semiconductor laser to connect said number of transistors to the semiconductor laser.

9. A semiconductor laser driving circuit according to claim 1, in which said transistors constituting said group comprise bipolar transistors having their corresponding main electrodes connected together and to said current source.

10. A semiconductor laser driving circuit according to claim 1, in which all of said transistors constituting said group include base electrodes connected in common to be simultaneously driven by a signal applied to said base electrodes.

11. A semiconductor laser driving circuit according to claim 1, further comprising a transistor parallel circuit having the same number of parallel connected transistors as said group, said transistor parallel circuit being connected to said group to form a differential pair.

12. A semiconductor laser driving circuit according to claim 1, wherein said means for selectively connecting comprises a conductive material connecting said number of transistors to the semiconductor laser by bonding.

13. A semiconductor laser driving circuit according to claim 1, wherein said means for selectively connecting comprises a change-over switch disposed between said number of transistors and the semiconductor laser to connect said number of transistors to the semiconductor laser.

14. A semiconductor laser driving circuit for driving a semiconductor laser having a current characteristic comprising:
   a current source capable of supplying a current to the semiconductor laser;
   a group of transistors, each having a respective optimum current and coupled to said current source; and
   means for selectively connecting a number of transistors from said group in parallel with one another such that the current characteristic of the semiconductor laser matches a sum of the optimum currents for the number of transistors.

15. A semiconductor laser driving circuit according to claim 14, wherein said means for selectively connecting comprises a conductive material connecting said number of transistors to the semiconductor laser by bonding.

16. A semiconductor laser driving circuit according to claim 14, wherein said means for selectively connecting comprises a change-over switch disposed between said number of transistors and the semiconductor laser to connect said number of transistors to the semiconductor laser.

17. A method of compensating a circuit for driving a semiconductor laser comprising the steps of:
   (a) fabricating the circuit with a group of transistors;
   (b) determining an optimum current for one of the transistors;
   (c) determining a maximum value of a driving pulse current of the semiconductor laser;
   (d) dividing the maximum value of the driving pulse current in said step (c) by the optimum current in said step (b) to determine an integral number;
   (e) operatively coupling in parallel a number of transistors from the group of transistors equal to the integral number after fabricating the circuit with the group of transistors in said step (a).

18. A method according to claim 17, further comprising the step of:
   (f) disabling from the group of transistors the remaining transistors not operatively coupled to the semiconductor laser in said step (e).

19. A method according to claim 18, wherein said step (f) comprises the substep of:

(f1) connecting the collectors of the remaining transistors not operatively coupled to the semiconductor laser to ground.

20. A semiconductor laser driving circuit coupled to a power source for driving a semiconductor laser which exhibits a current characteristic comprising:
    a group of transistors, each transistor having an optimum current, said group comprising:
        a number of transistors connected in parallel with one another and coupled to the power source to drive the semiconductor laser, the number selected from said group such that the current characteristic of the semiconductor laser matches a sum of the optimum currents for the number of transistors; and
    at least one transistor from the group connected to be disabled.

21. A semiconductor laser driving circuit according to claim 20, wherein said at least one of the transistors of the group is connected to be disabled by coupling to ground.

* * * * *

UNITED STATES PATENT AND TRADEMARK OFFICE
CERTIFICATE OF CORRECTION

PATENT NO. : 5,038,189

DATED : August 6, 1991

INVENTOR(S) : Fukudome

It is certified that error appears in the above-identified patent and that said Letters Patent is hereby corrected as shown below:

[57] Abstract, please substitute the following Abstract:

--A semiconductor laser driving circuit is arranged so that a number of transistors can be selected from a group of transistors. The group of transistors are disposed to be capable of parallel connection. According to the characteristics of a semiconductor laser, the selected transistors are connected in parallel and to the semiconductor laser. The number of transistors is selected from the group so that an optimum high-speed response can always be realized irrespective of the magnitude of the driving pulse current characteristic of the semiconductor laser.--

Signed and Sealed this

Twenty-fourth Day of November, 1992

Attest:

DOUGLAS B. COMER

*Attesting Officer*   *Acting Commissioner of Patents and Trademarks*